(12) United States Patent
Tian et al.

(10) Patent No.: US 12,557,485 B2
(45) Date of Patent: Feb. 17, 2026

(54) DISPLAY SUBSTRATE AND MANUFACTURING METHOD THEREFOR, AND DISPLAY DEVICE

(71) Applicant: BOE Technology Group Co., Ltd., Beijing (CN)

(72) Inventors: Hongwei Tian, Beijing (CN); Yanan Niu, Beijing (CN); Ming Liu, Beijing (CN); Ran Li, Beijing (CN); Jing Wang, Beijing (CN); Zheng Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 749 days.

(21) Appl. No.: 17/800,902

(22) PCT Filed: Oct. 13, 2021

(86) PCT No.: PCT/CN2021/123439
§ 371 (c)(1),
(2) Date: Aug. 19, 2022

(87) PCT Pub. No.: WO2022/111094
PCT Pub. Date: Jun. 2, 2022

(65) Prior Publication Data
US 2023/0075199 A1    Mar. 9, 2023

(30) Foreign Application Priority Data

Nov. 27, 2020    (CN) .......................... 202011358210.X (51) Int. Cl.
*H10K 59/124*    (2023.01)
*H10K 50/844*    (2023.01)
(Continued)

(52) U.S. Cl.
CPC ......... *H10K 59/124* (2023.02); *H10K 50/844* (2023.02); *H10K 71/00* (2023.02);
(Continued)

(58) Field of Classification Search
None
See application file for complete search history.

(56) References Cited

U.S. PATENT DOCUMENTS

| 2016/0190389 A1 | 6/2016 | Lee et al. |
| 2017/0256597 A1 | 9/2017 | Lee et al. |

(Continued)

FOREIGN PATENT DOCUMENTS

| CN | 107808896 A | 3/2018 |
| CN | 110494984 A | 11/2019 |

(Continued)

OTHER PUBLICATIONS

International Search Report for PCT/CN2021/123439 Mailed Dec. 23, 2021.

(Continued)

*Primary Examiner* — Michael Lebentritt
(74) *Attorney, Agent, or Firm* — Ling Wu; Stephen Yang; Ling and Yang Intellectual Property (57) ABSTRACT

A display substrate and a manufacturing method therefor, and a display device. The display substrate comprises a plurality of island areas that are spaced apart from each other, a plurality of hole areas, and bridge areas for connecting adjacent island areas. The island areas or/and the bridge areas comprise an edge area adjacent to the hole area; the edge area comprises a composite structure layer provided on a base substrate; a stepped structure is formed at a side surface of the composite structure layer facing the hole (Continued)

areas; the edge area further comprises an inorganic encapsulation layer disposed on the composite structure layer and the stepped structure.

10 Claims, 8 Drawing Sheets

(51) Int. Cl.
    *H10K 59/12*     (2023.01)
    *H10K 59/35*     (2023.01)
    *H10K 71/00*     (2023.01)
    *H10K 77/10*     (2023.01)

(52) U.S. Cl.
    CPC ......... *H10K 59/1201* (2023.02); *H10K 59/35* (2023.02); *H10K 77/111* (2023.02)

(56) References Cited

U.S. PATENT DOCUMENTS

| | | |
|---|---|---|
| 2017/0278920 A1 | 9/2017 | Park et al. |
| 2018/0052493 A1 | 2/2018 | Hong et al. |
| 2020/0052054 A1* | 2/2020 | Park .................. H04N 23/57 |
| 2021/0134196 A1 | 5/2021 | Niu et al. |
| 2021/0135154 A1 | 5/2021 | Liu et al. |
| 2022/0344422 A1 | 10/2022 | Xue et al. |

FOREIGN PATENT DOCUMENTS

| | | | |
|---|---|---|---|
| CN | 110494985 A | 11/2019 | |
| CN | 110970483 A | 4/2020 | |
| CN | 111554714 A | 8/2020 | |
| CN | 111554831 A | 8/2020 | |
| CN | 111564482 A | 8/2020 | |
| CN | 111584589 A | 8/2020 | |
| CN | 111755627 A | 10/2020 | |
| CN | 112490272 A | 3/2021 | |
| JP | 2008164835 A * | 7/2008 | |
| WO | WO-2021217525 A1 * | 11/2021 | ......... H01L 27/3258 |

OTHER PUBLICATIONS

Office Action dated Mar. 4, 2022 for Chinese Patent Application No. 202011358210.X and English Translation.
Decision to Grant dated Sep. 5, 2022 for Chinese Patent Application No. 202011358210.X and English Translation.

* cited by examiner

DISPLAY SUBSTRATE AND MANUFACTURING METHOD THEREFOR, AND DISPLAY DEVICE

CROSS-REFERENCE TO RELATED APPLICATIONS

This application is a national stage application of PCT Application No. PCT/CN2021/123439, which is filed on Oct. 13, 2021 and claims priority of Chinese Patent Application No. 202011358210.X, filed to the CNIPA on Nov. 27, 2020 and entitled "Display Substrate and Manufacturing Method Therefor, and Display Device", the content of which should be interpreted as being incorporated herein by reference.

TECHNICAL FIELD

Embodiments of the present disclosure relate to, but are not limited to, the field of display technology, and particularly to a display substrate, a manufacturing method for a display substrate, and a display device.

BACKGROUND

An organic electro luminescent display (OLED for short) panel has gradually become the mainstream in the display field due to its excellent performances such as low power consumption, high color saturation, wide view, thin thickness and a capability for achieving flexibility. The OLED panel can be widely applied in smart phones, tablet computers, televisions and other terminal products. The flexible OLED products have gradually become the mainstream of OLED display because they can meet various structures. With the development of flexible technology, flexible display panel gradually transits from being bendable, foldable to rollable, which indicates growing requirements for device flexibility.

In some stretchable display panels, island-bridge-hole structure is adopted to provide stretchability. The stretchable display substrate is carried by hard carrier plates such as glass in the preparation process. After the opening in the hole area is formed, a surface of the hard carrier plate will be exposed, and a surface, which will be exposed by the opening in the hole area on the hard carrier plate, is formed while the encapsulation layer is formed, such that the encapsulation layer is readily to be damaged when the hard carrier plate is striped off from the stretchable display substrate (removal process).

SUMMARY

The following is a summary of subject matters described herein in detail. The summary is not intended to limit the protection scope of claims.

An embodiment of the present disclosure provide a display substrate including a plurality of island areas spaced apart from each other, a plurality of hole areas, and bridge areas for connecting adjacent island areas, wherein the hole area includes one or more openings penetrating the display substrate;

the island area or/and the bridge area include an edge area adjacent to the hole area;

the edge area includes a composite structure layer disposed on a base substrate, a stepped structure is formed at a side surface of the composite structure layer towards the hole areas, the height of steps in the stepped structure gradually decreases along a direction towards the hole area, the first step with the lowest height in the stepped structure includes the base substrate, and a side surface of the first step towards the hole area is a first step side surface;

the edge area further includes an inorganic encapsulation layer disposed on the composite structure layer and disposed on the stepped structure, wherein an edge of the inorganic encapsulation layer is located on the first step side surface, and the inorganic encapsulation layer exposes at least a partial area of the first step side surface.

An embodiment of the present disclosure further provides a display device including the display substrate described above.

An embodiment of the present disclosure also provides a manufacturing method for a display substrate, wherein the display substrate includes a plurality of island areas spaced apart from each other, a plurality of hole areas, and bridge areas for connecting adjacent island areas, wherein the hole area includes one or more openings penetrating the display substrate, the manufacturing method including:

forming a base substrate of the display substrate on a hard carrier plate;

forming a composite structure layer on the base substrate of an edge area of the island area or/and the bridge area adjacent to the hole area, wherein a stepped structure is formed at a side surface of the composite structure layer towards the hole areas, the height of steps in the stepped structure gradually decreases along a direction towards the hole area, a first step with the lowest height in the stepped structure includes the base substrate, and a side surface of the first step towards the hole area is a first step side surface;

forming an inorganic encapsulation thin film in the edge area and on a surface of the hard carrier plate exposed by the hole area, wherein the inorganic encapsulation thin film is disposed on the composite structure layer and on the stepped structure;

removing the inorganic encapsulation thin film at an intersection position where the first step side surface intersects a surface of the hard carrier plate exposed by the hole area, alternatively, removing the inorganic encapsulation thin film on the first step side surface close to the intersection position to disconnect the inorganic encapsulation thin film of the edge area from the inorganic encapsulation thin film on the hard carrier plate, wherein the intersection position refers to an intersection position of the first step side surface and the surface of the hard carrier plate exposed by the hole area;

striping off the hard carrier plate from the base substrate to obtain the display substrate, wherein the inorganic encapsulation thin film in the edge area of the display substrate is an inorganic encapsulation layer, an edge of the inorganic encapsulation layer is located on the first step side surface, and the inorganic encapsulation layer exposes at least a partial area of the first step side surface.

Other aspects may be understood upon reading and understanding the drawings and the detailed description.

BRIEF DESCRIPTION OF DRAWINGS

The accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure.

FIG. 3a is a schematic diagram of a cross sectional structure of a display substrate according to an embodiment of the present disclosure taken along A-A in FIG. 2a.

FIG. 3b is a schematic diagram of a cross sectional structure of another display substrate of an embodiment of the present disclosure taken along A-A in FIG. 2a.

DETAILED DESCRIPTION

Those of ordinary skills in the art should understand that modifications or equivalent replacements may be made to the technical solutions of the embodiments of the present disclosure without departing from the spirit and scope of the technical solutions of the embodiments of the present disclosure, and should all fall within the scope of the claims of the present disclosure.

In the stretchable display panel, considering that wrinkles need to be evenly distributed in a certain range to uniformly distribute and match the corresponding wirings and pixels, in order to achieve higher resolution (PPI), paper-cutting is generally adopted, that is, slotting (generally in a straight line shaped or I-shaped opening) on the panel to provide stretchability. When using paper-cutting process, it is found that the stretchability is limited after slotting, and a part in the encapsulation structure which is in contact with the glass carrier plate is difficult to be completely disconnected during removal process, but the incomplete disconnection will cause pulling on the encapsulation layer on the side wall of the opening in the hole area, which will damage the encapsulation layer during the removal process.

Figure 1:
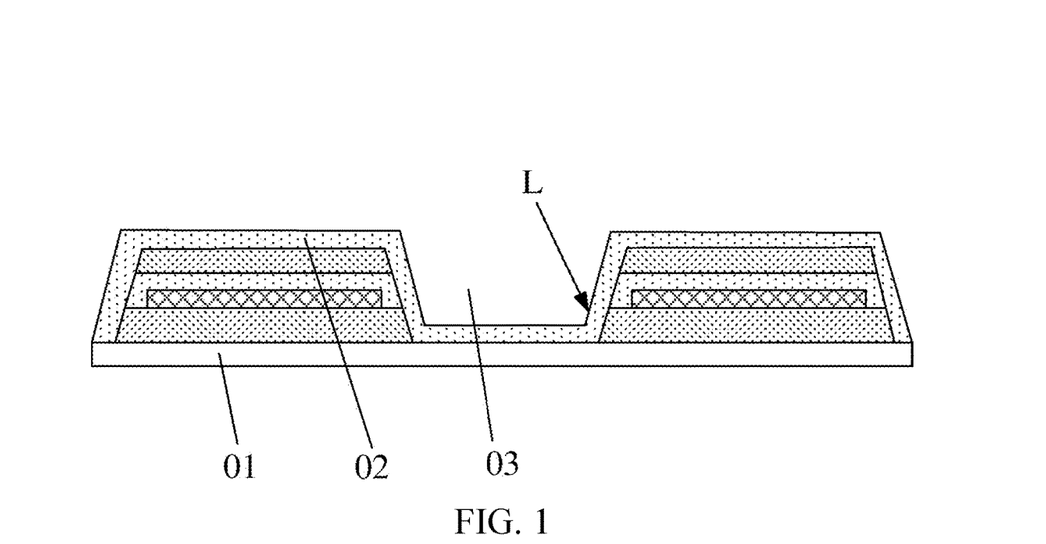
FIG. 1 is a schematic diagram of a cross sectional structure of a display substrate in some technology.

In some technologies, in the preparation process of a display substrate, a flexible base substrate is formed on a hard carrier at first, and then a film layer structure is formed on the flexible base substrate. After the display substrate is prepared, the hard carrier plate is striped off from the display substrate to obtain the display substrate. In the preparation process of the stretchable display substrate, an opening in the hole area is formed before the encapsulation layer is formed, and then when the encapsulation layer is formed, the encapsulation layer is formed on the display substrate and simultaneously on the surface of the hard carrier plate exposed by the opening in the hole area. In some technologies, in the process of striping the hard carrier plate off from the display substrate, it is difficult to completely disconnect the encapsulation layer on the hard carrier plate from the encapsulation layer on the display substrate, and the incomplete disconnection of the encapsulation layer in the process of striping the hard carrier plate will cause the encapsulation layer on the hard carrier to pull the encapsulation layer at the side wall of the hole area on the display substrate, which will cause cracks in the encapsulation layer at the side wall of the hole area on the display substrate and affect the encapsulation effect. As shown in FIG. 1, FIG. 1 is a schematic diagram of a cross sectional structure of a stretchable display substrate after forming an encapsulation layer in some technologies. The encapsulation layer 02 is formed on the display substrate and on a surface of the hard carrier plate 01 exposed by the opening 03 in the hole area of the display substrate. In the process of striping the hard carrier plate 01 off from the display substrate, an area of the encapsulation layer 02 at the side wall of the opening 03 on the display substrate close to the flexible base substrate (the area indicated by L) is readily to be cracked, which affects the encapsulation effect. Even if the encapsulation layer 02 is patterned in the structure of FIG. 1, residual photoresist exists due to the deep depth of the opening 03, which leads to incomplete removal of the encapsulation layer 02, and the encapsulation layer 02 at the side wall of the hole area 03 cannot be completely disconnected from the encapsulation layer 02 on the hard carrier plate 01, thus causing damage to the encapsulation layer 02 at the side wall of the hole area 03 during the removal process. In addition, the flexible base substrate will be damaged due to exceeding the stretching limit when the stretchable display substrate is stretched.

An embodiment of the present disclosure provide a display substrate including a plurality of island areas spaced apart from each other, a plurality of hole areas, and bridge areas for connecting adjacent island areas, wherein the hole area includes one or more openings penetrating the display substrate. The island area or/and the bridge area include an edge area adjacent to the hole area. The edge area includes a composite structure layer disposed on a base substrate, a stepped structure is formed at a side surface of the composite structure layer towards the hole areas, the height of steps in the stepped structure gradually decreases along a direction towards the hole area, the first step with the lowest height in the stepped structure includes the base substrate, and a side surface of the first step towards the hole area is a first step side surface. The edge area further includes an inorganic encapsulation layer disposed on the composite structure layer and disposed on the stepped structure, wherein an edge of the inorganic encapsulation layer is located on the first step side surface, and the inorganic encapsulation layer exposes at least a partial area of the first step side surface.

In a display substrate according to an embodiment of the present disclosure, a stepped structure is formed at an edge area of the island area or/and the bridge area towards the hole area, an inorganic encapsulation layer of the edge area is formed on the stepped structure, and an edge of the inorganic encapsulation layer is positioned on a side surface of the first step with the lowest height towards the hole area, and the inorganic encapsulation layer exposes at least a partial area of the first step side surface. Therefore, due to the design of the stepped structure, compared with the thickness of the inorganic encapsulation layer at other positions, the thickness of the inorganic encapsulation layer deposited at the step during the preparation process is thinner, such that the inorganic encapsulation layer is readily to be etched completely in the etching process and be disconnected completely from the inorganic encapsulation layer on the hard carrier plate, thereby reducing the damage such as cracks resulted from pulling the inorganic encapsulation layer at the side wall of the hole area by the inorganic encapsulation layer on the hard carrier plate during the removal process.

Figure 2A:
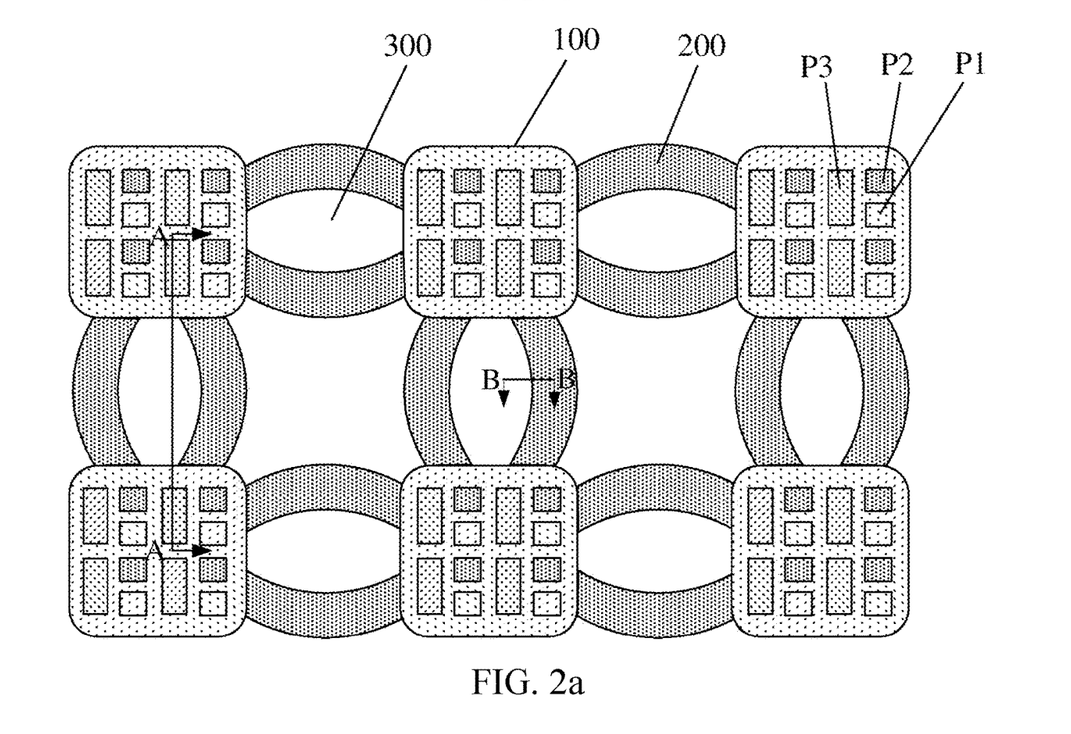
FIG. 2a is a schematic diagram of a planar structure of a stretchable area of a display substrate according to an embodiment of the present disclosure.

In some exemplary embodiments, the display substrate according to an embodiment of the present disclosure includes a stretchable area, as illustrated in FIG. 2a. FIG. 2a illustrates a structure of a partial area of the stretchable area, which may be regarded as a repeating unit of the stretchable area. The stretchable area includes a plurality of island areas 100 spaced apart from each other, a plurality of hole areas 300, and a bridge area 200 connecting adjacent island areas 100, wherein the hole area includes one or more openings penetrating the display substrate. A plurality of hole areas 300 may be surrounded around each island area 100, and a bridge area 200 is located between adjacent hole areas 300 and between adjacent island areas 100. In a plane parallel to the display substrate, the shape of each island area 100 may be rectangular, a plurality of island areas 100 may be arranged in an array, and the shape of the bridge area 200 may be rectangular, arc-shaped, T-shaped, L-shaped, I-shaped, or the like. In this example, both the island area 100 and the bridge area 200 are adjacent to the hole area 300, both the bridge area 200 and the island area 100 include an edge area adjacent to the hole area 300. In other examples, the bridge area 200 is adjacent to the hole area 300, and the island area 100 may not be adjacent to the hole area 300, only the bridge area 200 includes an edge area adjacent to the hole area 300. The base substrate of the display substrate may be a flexible base substrate, so that the stretchable area of the display substrate can be stretched, the island area 100 is disposed to display an image, the hole area 300 is disposed to provide a deformation space during stretching, and the bridge area 200 is disposed for wiring (enable signal communication between adjacent island areas 100) and tension force transmission. Each island area 100 may include a plurality of pixel units, each pixel unit includes a plurality of sub-pixels emitting light of different colors, for example, each pixel unit includes three sub-pixels containing a first sub-pixel P1, a second sub-pixel P2, and a third sub-pixel P3, wherein the first sub-pixel P1, the second sub-pixel P2, and the third sub-pixel P3 may be configured to emit red light, green light, and blue light, respectively. By adjusting the luminance of a plurality of sub-pixels of each pixel unit, the corresponding pixel unit can substantially display any desired color. Each sub-pixel includes one light emitting device, each light emitting device may be an OLED device, including an anode, an organic light emitting layer and a cathode, which are stacked, wherein the organic light emitting layer emits light under a voltage between the anode and the cathode. When a stretchable area is stretched under an action of an external force, deformation mainly occurs in the bridge area 200, and light emitting devices of the island area 100 substantially maintain their shapes without being damaged.

Figure 2B:
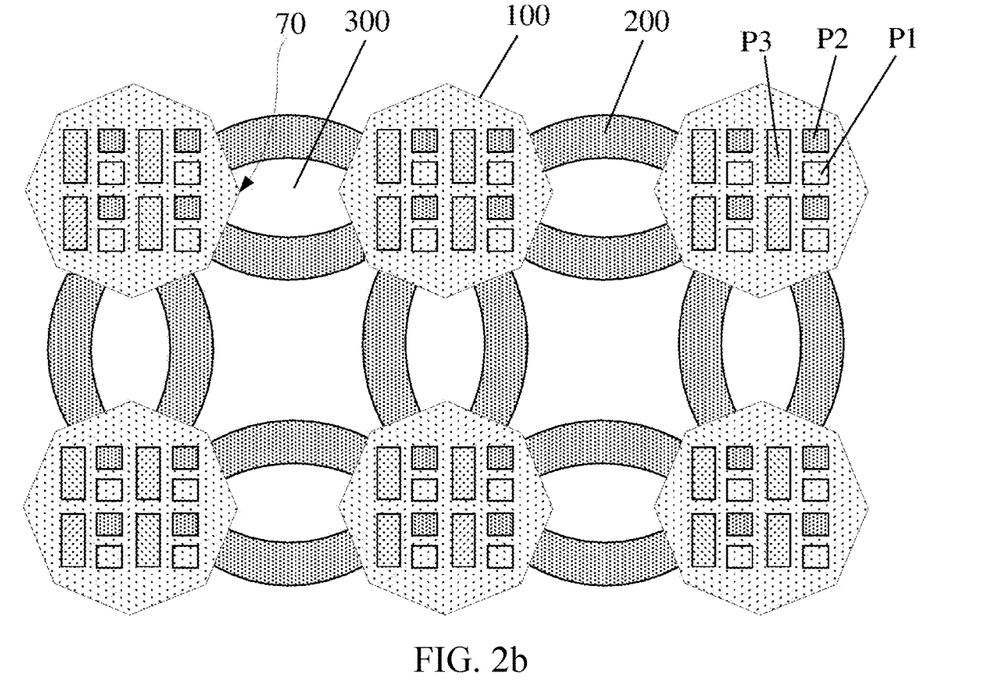
FIG. 2b is a schematic diagram of a planar structure of a stretchable area of another display substrate according to an embodiment of the present disclosure.

In some exemplary embodiments, as shown in FIG. 2b, FIG. 2b illustrates a structure of a partial area of another stretchable area, which may be regarded as a repeating unit of the stretchable area. In this example, the shape of the island area 100 may be octagonal and the edge area of each island area 100 towards the hole area 300 is formed with a convex edge 70. The first step side surface may include a first plane and a second plane intersecting each other, and the convex edge 70 protruding towards the hole area 300 is formed at the intersection of the first plane and second plane. The first plane and the second plane may correspond to two sides of the octagonal shape, respectively. In the stepped structure, the side surfaces of other steps towards the hole area 300 can be provided with convex edges protruding towards the hole area 300 formed by two intersecting planes. By providing the convex edge 70 structure, the thickness of the inorganic encapsulation thin film subsequently formed in the edge area can be thinned at the convex edge 70, which is beneficial to completely etching off a partial area of the inorganic encapsulation thin film in the subsequent etching process, such that the inorganic encapsulation thin film in the edge area is completely disconnected from the inorganic encapsulation thin film on the hard carrier plate. In addition, the design of the convex edge structure is beneficial to buffer the stress caused by the deformation of the island area 100.

Figure 3A:
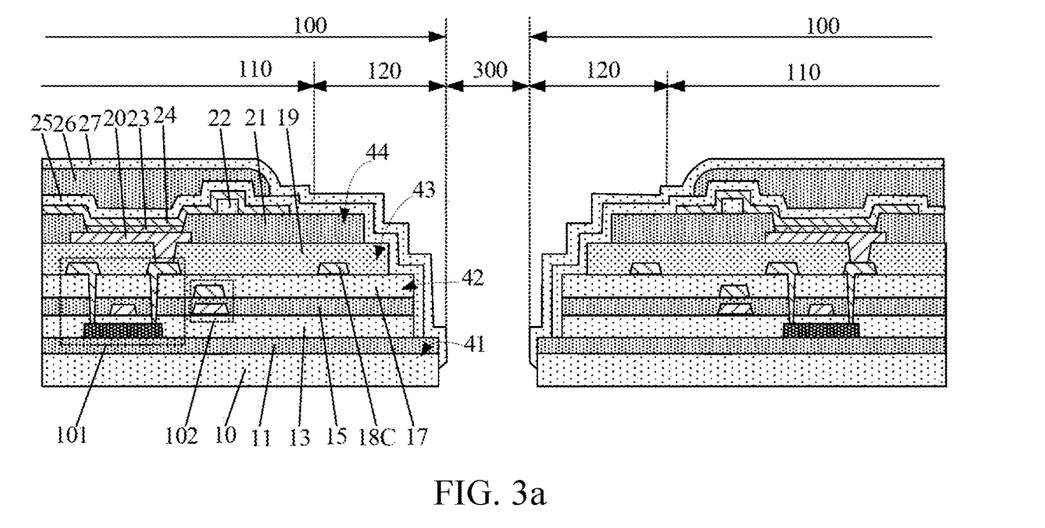

In some exemplary embodiments, as shown in FIG. 3a, FIG. 3a is a schematic diagram of cross sectional structure taken along A-A in FIG. 2a. In this example, a hole area 300 is formed between two adjacent island areas 100 and the island area 100 includes a light emitting area 110 and an edge area 120 adjacent to the hole area 300. The light emitting area 110 may include a plurality of pixel units, each pixel unit includes a plurality of sub-pixels emitting light of different colors, each sub-pixel includes one light emitting device, each light emitting device may be an OLED device including an anode 20, an organic light emitting layer 23 and a cathode 24, which are stacked, and the organic light emitting layer 23 emits light at a voltage between the anode 20 and the cathode 24. As shown in FIG. 3a, for example, the light emitting area 110 includes a drive structure layer disposed on the base substrate 10, a light emitting structure layer disposed on the drive structure layer, and an encapsulation structure layer disposed at a side of the plurality of light emitting devices away from the base substrate 10. The light emitting structure layer includes a plurality of light emitting devices, each of which may be an OLED device including an anode 20, an organic light emitting layer 23, and a cathode 24, which are stacked. The drive structure layer includes a pixel drive circuit, the pixel drive circuit includes a plurality of thin film transistors and a storage capacitor 102, wherein a drain electrode of one thin film transistor 101 is connected to an anode 20 of a light emitting device to drive the light emitting device to emit light. The encapsulation structure layer may be a composite structure including an organic material and an inorganic material, for example, including a first inorganic encapsulation layer 25, an organic encapsulation layer 26, and a second inorganic encapsulation layer 27, which are sequentially stacked.

In some exemplary embodiments, as shown in FIG. 3a, the edge area 120 includes a composite structure layer disposed on the base substrate 10, the side surface of the composite structure layer towards the hole area 300 is formed with a stepped structure in which the height of the step gradually decreases in the direction towards the hole area 300. The first step 41 with the lowest height in the stepped structure includes the base substrate 10, and the side surface of the first step 41 towards the hole area 300 is the first step side surface. The edge area 120 also includes an inorganic encapsulation layer disposed on the composite structure layer and disposed on the stepped structure, the edge of the inorganic encapsulation layer is located on the first step side surface, and the inorganic encapsulation layer exposes an area of the first step side surface close to a side surface of the base substrate 10 away from the display side. The number of layers of the inorganic encapsulation layer of the edge area 120 may be the same as the number of layers of the inorganic encapsulation layer of the encapsulation structure layer of the light emitting area 110. In this example, the inorganic encapsulation layer of the edge area 120 includes a first inorganic encapsulation layer 25 and a second inorganic encapsulation layer 27, which are stacked and may be stacked on the stepped structure, and an edge of the second inorganic encapsulation layer 27 may cover an edge of the first inorganic encapsulation layer 25. In this embodiment, an area of the first step side surface outside the edge of the second inorganic encapsulation layer 27 close to the side surface away from the display side of the base substrate 10 is not covered by the first inorganic encapsulation layer 25 or the second inorganic encapsulation layer 27. In one example of this embodiment, the edge of the second inorganic encapsulation layer 27 may be located in an area of the first step side surface corresponding to the base substrate 10. In the process of forming the second inorganic encapsulation layer 27, the second inorganic encapsulation layer 27 is more readily disconnected from the second inorganic encapsulation layer formed on the surface of the hard carrier plate exposed by the hole area 300 on the area of the first step side surface corresponding to the base substrate 10, so as to prevent the second inorganic encapsulation layer on the hard carrier from pulling the second inorganic encapsulation layer 27 on the sidewall of the hole area 300 and then causing cracks in the process of striping the display substrate from the hard carrier.

In some exemplary embodiments, the composite structure layer of the edge area may include the inorganic composite insulation layer disposed on the base substrate and the organic composite layer disposed on the inorganic composite insulation layer, and the stepped structure includes at least one step formed on the inorganic composite insulation layer and at least one step formed on the organic composite layer. The number of steps of the stepped structure described in this example may be designed according to the structure of the composite structure layer and the organic composite layer, for example, may be three, four, or the like.

In an example of the present embodiment, as shown in FIG. 3a, the inorganic composite insulation layer includes a first insulation layer 11, a second insulation layer 13, a third insulation layer 15, and a fourth insulation layer 17 which are sequentially stacked on the base substrate 10; the organic composite layer includes a first organic insulation layer and a second organic insulation layer which are sequentially stacked on the fourth insulation layer 17. In an example of the present embodiment, the first organic insulation layer is located at same layer and made of same material as the planarization layer 19 of the island area 100, and the second organic insulation layer is located at same layer and made of same material as the pixel definition layer 21 of the island area 100.

Figure 3B:
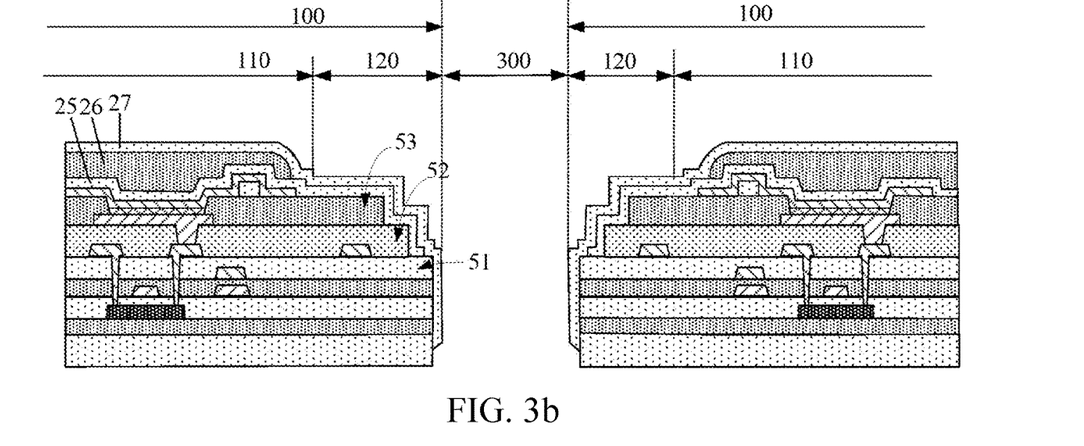

By way of example, as shown in FIG. 3a, the stepped structure may include a first step 41 formed by the first insulation layer 11 and the base substrate 10, a second step 42 formed by the second insulation layer 13, the third insulation layer 15 and the fourth insulation layer 17, a third step 43 formed by the first organic insulation layer, and a fourth step 44 formed by the second organic insulation layer. Alternatively, as shown in FIG. 3b, the stepped structure includes a first step 51 formed by the base substrate 10 and the inorganic composite insulation layer, a second step 52 formed by the first organic insulation layer, and a third step 53 formed by the second organic insulation layer, wherein the second organic insulation layer is located at same layer and made of same material as the pixel definition layer 21 of the island area 100. In this example, designing the stepped structure at the edge area and arranging the inorganic encapsulation layer on the stepped structure does not affect the encapsulation performance of the display substrate, and can maintain moderate elasticity. During the removal process and subsequent stretching, after reaching the required stretching amount, the corresponding structural reinforcement occurs between the inorganic film layers, thus improving the stretch performance and maintaining the ability to resist stretch damage.

In some exemplary embodiments, the edge area of the island area may include signal leads that may connect signal lines of the light emitting area and signal connection lines of the bridge area through which signal communication between adjacent island areas is made. By way of example, in the first direction, as shown in FIG. 3a, the signal leads of the edge area 120 of the island area 100 may include data leads 18C, power lines, and the like. In the second direction, which intersects the first direction, the signal leads of the edge area of the island area may include gate leads or the like.

Figure 3C:
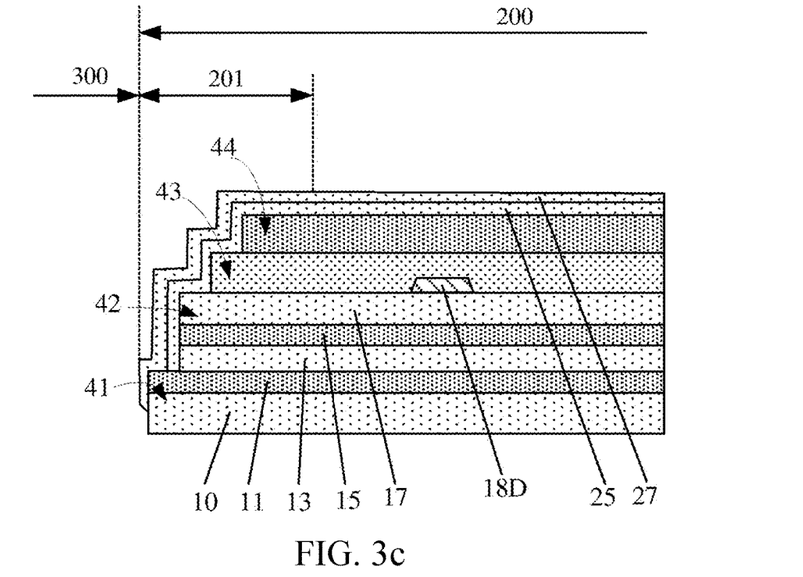
FIG. 3c is a schematic diagram of a cross sectional structure taken along B-B in FIG. 2a in some exemplary embodiments.

In some exemplary embodiments, as shown in FIG. 3c, which is a schematic diagram of a cross-sectional structure taken along B-B in FIG. 2a, the bridge area 200 includes an edge area 201 adjacent to the hole area 300, and the edge area 201 includes a first insulation layer 11, a second insulation layer 13, a third insulation layer 15, a fourth insulation layer 17, a first organic insulation layer and a second organic insulation layer which are sequentially stacked on the base substrate 10. The stepped structure includes a first step 41 formed by the first insulation layer 11 and the base substrate 10, a second step 42 formed by the second insulation layer 13, the third insulation layer 15 and the fourth insulation layer 17, a third step 43 formed by the first organic insulation layer, and a fourth step 44 formed by the second organic insulation layer. The first organic insulation layer is located at same layer and made of same material as the planarization layer 19 of the island area 100, and the second organic insulation layer is located at same layer and made of same material as the pixel definition layer 21 of the island area 100. The edge area 201 also includes a first inorganic encapsulation layer 25 and a second inorganic encapsulation layer 27 disposed on the stepped structure, the edge of the second inorganic encapsulation layer 27 is located on the first step side surface, and the second inorganic encapsulation layer 27 exposes at least a partial area of the first step side surface. An area of the bridge area 200 located at the edge area 201 away from the hole area 300 includes a signal connection line, which includes a data connection line 18D disposed on the fourth insulation layer 17, and the data connection line 18D is connected to the data line of the island area 100 through the data lead line 18C of the edge area 120 of the island area 100.

A structure of the display substrate according to the present disclosure will be described below through an example of a preparation process of the display substrate. A "patterning process" mentioned in the present disclosure includes a process such as deposition of a film layer, photoresist coating, mask exposure, development, etching, and photoresist stripping. Deposition may be any one or more of sputtering, evaporation, and chemical vapor deposition, coating may be any one or more of spray coating and spin coating, and etching may be any one or more of dry etching and wet etching. A "thin film" refers to a layer of a thin film prepared from a material on a base substrate using a process of deposition or coating. If the "thin film" does not need a patterning process in the entire manufacturing process, the "thin film" may also be called a "layer". If the "thin film" needs a patterning process in the entire manufacturing process, the "thin film" is called a "thin film" before the patterning process is performed and is called a "layer" after the patterning process is performed. The "layer" after the patterning process includes at least one "pattern". "A and B are disposed in a same layer" mentioned in the present disclosure means that A and B are simultaneously formed through a same patterning process. "An orthographic projection of A contains an orthographic projection of B" means that the orthographic projection of B falls within a range of the orthographic projection of A, or the orthographic projection of A covers the orthographic projection of B.

In some exemplary embodiments, the preparation process of the display substrate in FIG. 3a may include the following steps:

(1) A flexible base substrate 10 is prepared on a hard carrier plate 1.

The flexible base substrate 10 may include one flexible layer or a plurality of flexible layers, taking one flexible layer structure as an example, the flexible base substrate 10 includes a flexible layer and a barrier layer (Barrier) which are stacked. The material of the flexible layer may be polyimide (PI), polyethylene terephthalate (PET) or a surface-treated polymer soft film or the like. The material of the barrier layer may be silicon nitride (SiNx) or silicon oxide (SiOx), and are used to improve the water and oxygen resistance of the base substrate.

Figure 4:
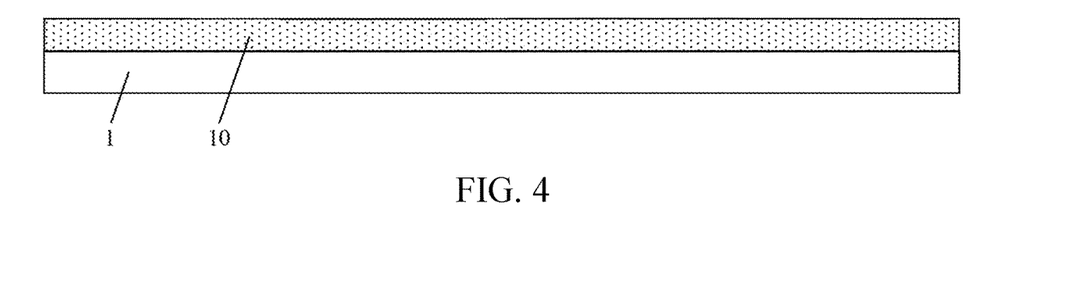
FIG. 4 is a schematic diagram of a structure after a base substrate is formed on a hard carrier plate in some other exemplary embodiments.

The process for preparing of the flexible base substrate 10 may include: first coating a layer of polyimide on the carrier plate 1, curing to form a film, and then forming a flexible layer; then, depositing a layer of barrier thin film on the flexible layer to form a barrier layer (Barrier1) covering the flexible layer, thus completing the preparation of the flexible base substrate 10, as shown in FIG. 4. After this process, the island area 100, the bridge area 200 and the hole area 300 all include the flexible base substrate 10.

Figure 5:
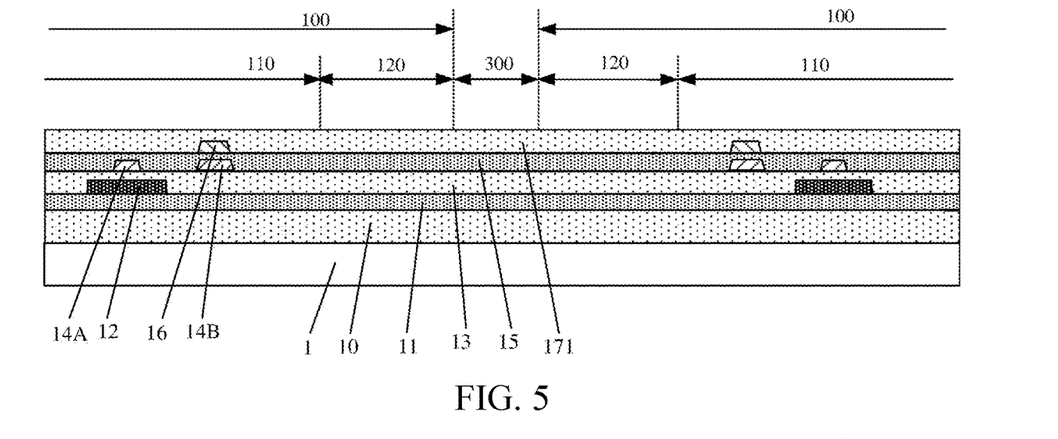
FIG. 5 is a schematic diagram of a structure after a fourth insulation thin film is formed on the base substrate in some exemplary embodiments.

(2) A first insulation thin film and an active layer thin film are sequentially deposited on the flexible base substrate 10, and the active layer thin film is patterned by a patterning process to form a first insulation layer 11 covering the entire flexible base substrate 10 and a pattern of an active layer disposed on the first insulation layer 11. The pattern of the active layer is formed at the light emitting area 110 of the island area 100, at least including the active layer 12, as shown in FIG. 5. After this patterning process, the edge area 120 of the island area, the bridge area 200 and the hole area 300 includes the first insulation layer 11 disposed on the flexible base substrate 10. In other examples, before the active layer thin film is deposited, a shielding layer may be formed on the first insulation thin film, and the shielding layer is formed at an intersection position in the light emitting area 110 of the island area 100 corresponding to a subsequent pattern of the active layer, and then the active layer film is deposited and patterned to form the pattern of the active layer. The shielding layer can function as a shielding to light to prevent light from affecting the active layer 12.

Subsequently, a second insulation thin film and a first metal thin film are sequentially deposited, and the first metal thin film is patterned by a patterning process to form a second insulation layer 13 covering the pattern of the active layer and a pattern of a first gate metal layer disposed on the second insulation layer 13. The pattern of the first gate metal layer include a gate electrode 14A, a first capacitor electrode 14B and a gate (not shown in the figure) formed in the light emitting area 110 of the island area 100, and gate connection line formed in the bridge area 200 (not shown in the figure), as shown in the FIG. 5. After this patterning process, the edge area 120 of the island area 100, the edge area of the bridge area 200, and the hole area 300 includes the first insulation layer 11 and the second insulation layer 13 stacked on the flexible base substrate 10.

Subsequently, a third insulation thin film and a second metal thin film are sequentially deposited, and the second metal thin film is patterned by a patterning process to form a third insulation layer 15 overlying the first gate metal layer and a pattern of a second gate metal layer disposed on the third insulation layer 15. The pattern of the second gate metal layer includes a second capacitor electrode 16 formed in the light emitting area 110 of the island area 100, and the position of the second capacitor electrode 16 corresponds to that of the first capacitor electrode 14B, as shown in FIG. 5. After this patterning process, the edge area 120 of the island area 100, the bridge area 200 and the hole area 300 includes the first insulation layer 11, the second insulation layer 13 and the third insulation layer 15 stacked on the flexible base substrate 10.

Figure 6:
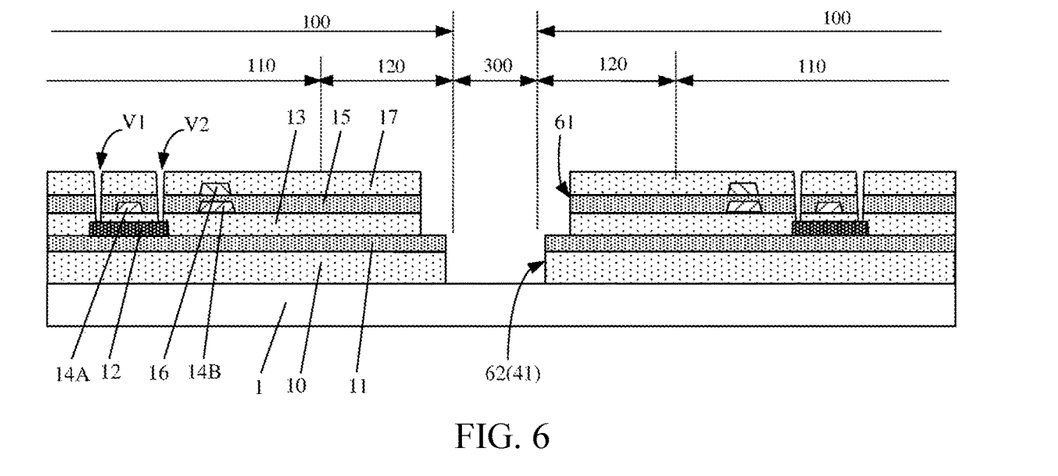
FIG. 6 is a schematic diagram of a structure after a fourth insulation layer, a first opening and a second opening are formed in some exemplary embodiments.

Subsequently, a fourth insulation thin film is deposited and patterned by a patterning process to form a pattern of a fourth insulation layer 17 covering the second gate metal layer, as shown in FIG. 6, the fourth insulation layer 17 located at the light emitting area 110 of the island area 100 is provided with two vias, V1 and V2, the fourth insulation layer 17, the third insulation layer 15 and the second insulation layer 13 in the two vias are etched away to expose a surface of the active layer 12. A first opening 61 penetrating through the fourth insulation layer 17, the third insulation layer 15, and the second insulation layer 13 is formed in a portion of the fourth insulation layer 17 corresponding to the hole area 300, and the fourth insulation layer 17, the third insulation layer 15, and the second insulation layer 13 in the first opening 61 are etched away to expose a surface of the first insulation layer 11.

Subsequently, a second opening 62 is formed in a portion of the first insulation layer 11 exposed by the first opening 61 and the second opening 62 penetrates through the base substrate 10. An orthographic projection of the first opening 61 on the base substrate 10 contains an orthographic projection of the second opening 62 on the base substrate 10. Thus, in the edge area 120 of the island area 100 adjacent to the hole area 300 and/or in the edge area of the bridge area 200 adjacent to the hole area 300, a portion of the base substrate 10 and the first insulation layer 11 protruding from the side wall of the first opening 61 forms the first step 41 of the stepped structure, as shown in FIG. 6. In some examples of the present embodiment, a convex edge 70 (shown in FIG. 2*b*) may be formed on a side surface (i.e., a first step side surface) of the first insulation layer 11 towards the second opening 62 and the base substrate 10 within the edge area 120 of the island area 100, while the second opening 62 is formed. After this process, the edge area 120 of the island area 100 adjacent to the hole area 300 or/and the edge area of the bridge area 200 adjacent to the hole area 300 includes the first insulation layer 11, the second insulation layer 13, the third insulation layer 15 and the fourth insulation layer 17 stacked on the base substrate 10. The first step 41 is formed in the edge area, and the base substrate 10 of the hole area 300 and the film layer thereon are removed.

Figure 7:
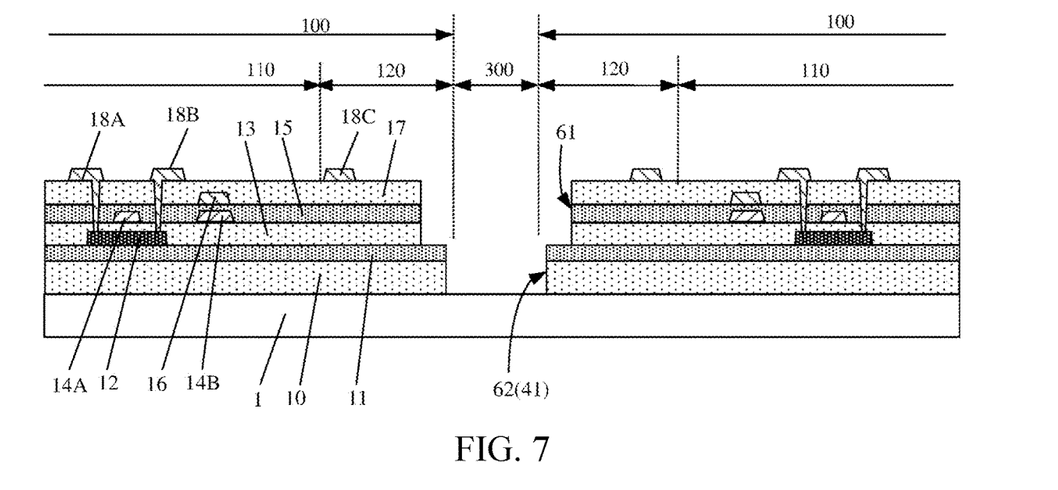
FIG. 7 is a schematic diagram of a structure after a third metal layer is formed in some exemplary embodiments.

Subsequently, a third metal film is deposited, and patterned through a pattern process to form a pattern of a third metal layer pattern on the fourth insulation layer 17. The pattern of the third metal layer includes a source electrode 18A, a drain electrode 18B and a data line (not shown in the figure) located in the light emitting area 110 of the island area 100, and a data lead line 18C located at the edge area 120 of the island area 100, and a data connection line of the bridge area 200. The source electrode 18A is connected with the active layer 12 through the via V1 penetrating through the fourth insulation layer 17, the third insulation layer 15, and the second insulation layer 13, and the drain electrode 18B is connected with the active layer 12 through the via V2 penetrating through the fourth insulation layer 17, the third insulation layer 15, and the second insulation layer 13, as shown in FIG. 7.

At this point, the drive structure layer of the light emitting area 110 of the island area 100, the signal lead lines of the edge area 120 of the island area 100, and the wirings of the bridge area 200 are prepared on the flexible base substrate 10. In the drive structure layer of the island area 100, the active layer 12, the gate electrode 14A, the source electrode 18A, and the drain electrode 18B constitute a thin film transistor 101, which may be a drive transistor in a pixel drive circuit, and the drain electrode 18B of the drive transistor is connected with an anode in the light emitting device. The first capacitor electrode 14B and the second capacitor electrode 16 constitute a storage capacitor 102. The edge area 120 of the island area 100 and the edge area of the bridge area 200 include the inorganic composite insulation layer disposed on the flexible base substrate 10, and the inorganic composite insulation layer includes the first insulation layer 11, the second insulation layer 13, the third insulation layer 15, and the fourth insulation layer 17 which are stacked. The bridge area 200 includes a gate connection line disposed on the second insulation layer 13, and a data connection line disposed on the inorganic composite insulation layer. The gate connection line is connected with the gate line in the adjacent island areas 100, and the data connection line may be connected with the data line in the adjacent island areas 100 so as to communicate signals between the adjacent island areas 100.

In an exemplary embodiment, the first insulation thin film, the second insulation thin film, the third insulation thin film and the fourth insulation thin film may use any one or more of silicon oxide (SiOx), silicon nitride (SiNx) and silicon oxynitride (SiON), and may be a single layer, multiple layers or a composite layer. The first insulation layer 11 is referred to as a buffer layer, which is used for improving capabilities of water-resistance and oxygen-resistance of the flexible base substrate 10. The second insulation layer 13 and the third insulation layer 15 are referred to as gate insulation (GI) layers. The fourth insulation layer 17 is referred to as an interlayer insulation (ILD) layer. The first metal thin film, the second metal thin film and the third metal thin film may be made of metal materials, e.g., any one or more of silver (Ag), copper (Cu), aluminum (Al), titanium (Ti) and molybdenum (Mo), or an alloy material of the above metals, such as aluminum neodymium alloy (AlNd) or molybdenum niobium alloy (MoNb), and may have a single-layer structure or a multi-layer composite structure, such as Ti/Al/Ti, etc. The active layer thin film may be made of materials, such as amorphous indium gallium zinc oxide (a-IGZO), zinc oxynitride (ZnON), indium zinc tin oxide (IZTO), amorphous silicon (a-Si), polycrystalline silicon (p-Si), sexithiophene, or polythiophene. That is, the present disclosure is applicable to transistors preparationd based on oxide technology, silicon technology or organic matter technology.

Figure 8:
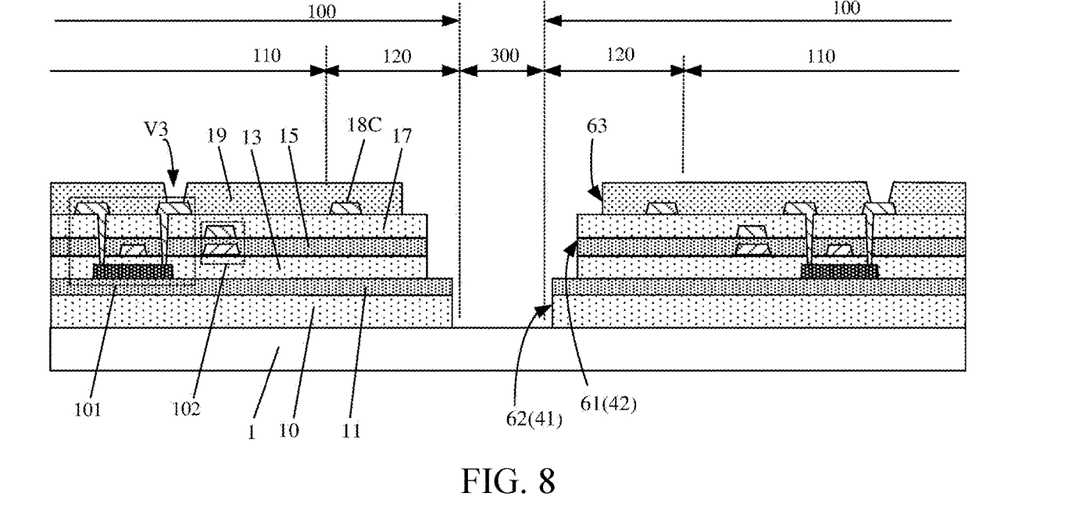
FIG. 8 is a schematic diagram of a structure after a planarization layer and a third opening are formed in some exemplary embodiments.

(3) An planarization layer 19 and a light emitting structure layer are formed on the flexible base substrate 10 formed with the above patterns. In some exemplary embodiments, the preparation process of this step may include following steps:

A planarization thin film of organic material is coated on the flexible base substrate 10 formed with the aforementioned patterns, and a planarization layer (PLN) 19 is formed by masking, exposure and development processes. A via V3 is formed on the planarization layer 19 of the island area 100. The planarization layer 19 in the via V3 is developed to expose the surface of the drain electrode 18B of the thin film transistor 101. A third opening 63 is formed in an area of the planarization layer 19 corresponding to the hole area 300. The planarization layer 19 in the third opening 63 is developed. An orthographic projection of the third opening 63 on the base substrate 10 contains an orthographic projection of the first opening 61 on the base substrate 10. Thus, in the edge area 120 of the island area 100 adjacent to the hole area 300 and/or in the edge area of the bridge area 200 adjacent to the hole area 300, the fourth insulation layer 17, the third insulation layer 15 and the second insulation layer 13, which form the first opening 61, protrude from the side wall of the third opening 63 to form the second step 42 of the stepped structure, as shown in FIG. 8. After this patterning process, the edge area 120 of the island area 100 adjacent to the hole area 300 or/and the edge area of the bridge area 200 adjacent to the hole area 300 include a planarization layer 19, which is the first organic insulation layer, disposed on the fourth insulation layer 17.

A transparent conductive thin film is deposited on the flexible base substrate 10 on which the aforementioned patterns are formed, and the transparent conductive thin film is patterned by a patterning process to form a pattern of an anode 20. The anode 20 is formed on the planarization layer 19 in the light emitting area 110 of the island area 100 and is connected with the drain electrode 18B of the thin film transistor 101 through the via hole V3 on the planarization layer 19. In an exemplary implementation mode, the material of the transparent conductive thin film may be indium tin oxide (ITO) or indium zinc oxide (IZO).

Figure 9:
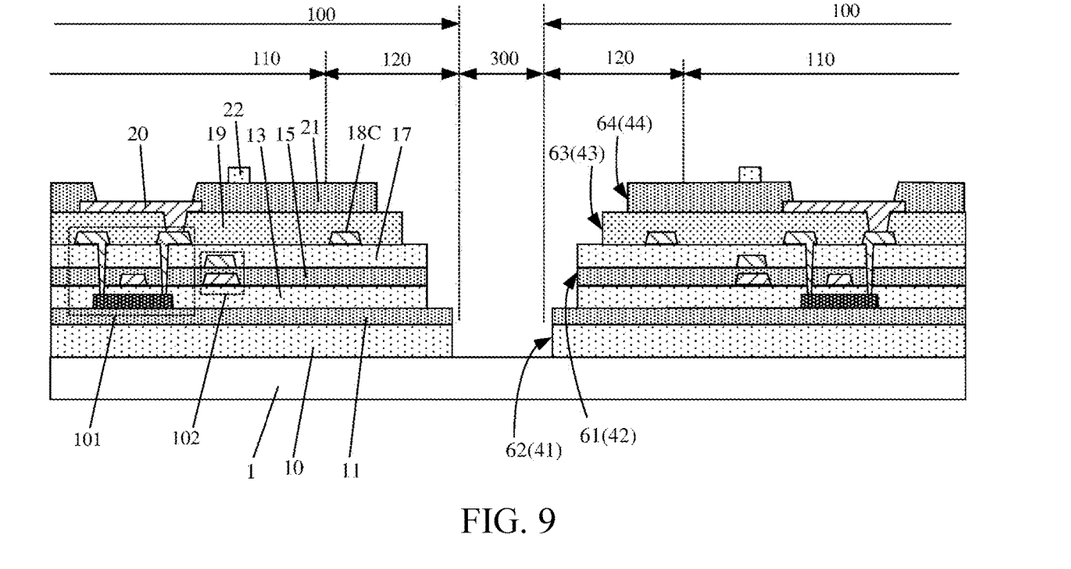
FIG. 9 is a schematic diagram of a structure after an anode, a pixel definition layer, a fourth opening and a post spacer are formed in some exemplary embodiments.

A pixel definition thin film is coated on the flexible base substrate 10 on which the aforementioned patterns are formed, and a pattern of a pixel definition layer (PDL) 21 is formed by masking, exposure and development processes. The pixel definition layer 21 of the island area 100 is provided with pixel openings, and the pixel definition layer 21 within the pixel opening is developed away to expose a surface of the anode 20. A fourth opening 64 is formed in an area of the pixel definition layer 21 corresponding to the hole area 300 and the pixel definition layer 21 in the fourth opening 64 is developed. An orthographic projection of the fourth opening 64 on the base substrate 10 contains an orthographic projection of the third opening 63 on the base substrate 10. Thus, in the edge area 120 of the island area 100 adjacent to the hole area 300 and/or in the edge area of the bridge area 200 adjacent to the hole area 300, a portion of the planarization layer 19, which forms the third opening 63, protrudes from the side wall of the fourth opening 64 to form the third step 43 of the stepped structure, and the pixel definition layer 21 in the edge area, which forms the fourth opening 64, forms the fourth step 44 of the stepped structure, as shown in FIG. 9. After this patterning process, the edge area 120 of the island area 100 adjacent to the hole area 300 or/and the edge area of the bridge area 200 adjacent to the hole area 300 include the planarization layer 19 and the pixel definition layer 21 stacked on the fourth insulation layer 17, wherein the planarization layer 19 is the first organic insulation layer and the pixel definition layer 21 is the second organic insulation layer.

A post spacer thin film is coated on the flexible base substrate 10 formed with the aforementioned pattern, and a post spacer 22 is formed on the pixel definition layer 21 of the light emitting area 110 of the island area 100 through masking, exposure, and development processes, as shown in FIG. 9. The post spacer 22 may serve as a support to support the mask during subsequent evaporation of the organic light emitting layer.

Figure 10:
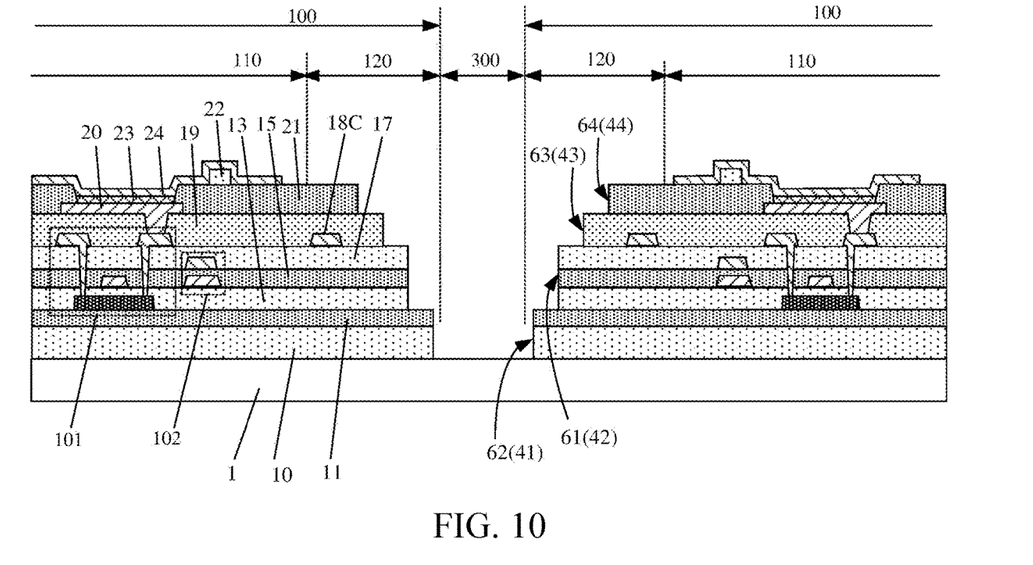
FIG. 10 is a schematic diagram of a structure after a light emitting layer and a cathode are formed in some exemplary embodiments.

An organic light emitting layer 23 and a cathode 24 are sequentially formed on the flexible base substrate 10 formed with the above patterns, as shown in FIG. 10. The organic light emitting layer 23 and the cathode 24 are both formed in the island area 100, the organic light emitting layer 23 is formed in a pixel opening of the pixel definition layer 21 and connected with the anode 20, and the cathode 24 is formed on the organic light emitting layer 23 and on the pixel definition layer 21. Both the organic light emitting layer 23 and the cathode 24 may be formed by an evaporation process. The material of the cathode 23 may be made of any one or more of magnesium (Mg), silver (Ag), aluminum (Al), copper (Cu) and lithium (Li), or an alloy made of any one or more of the above metals.

Figure 11:
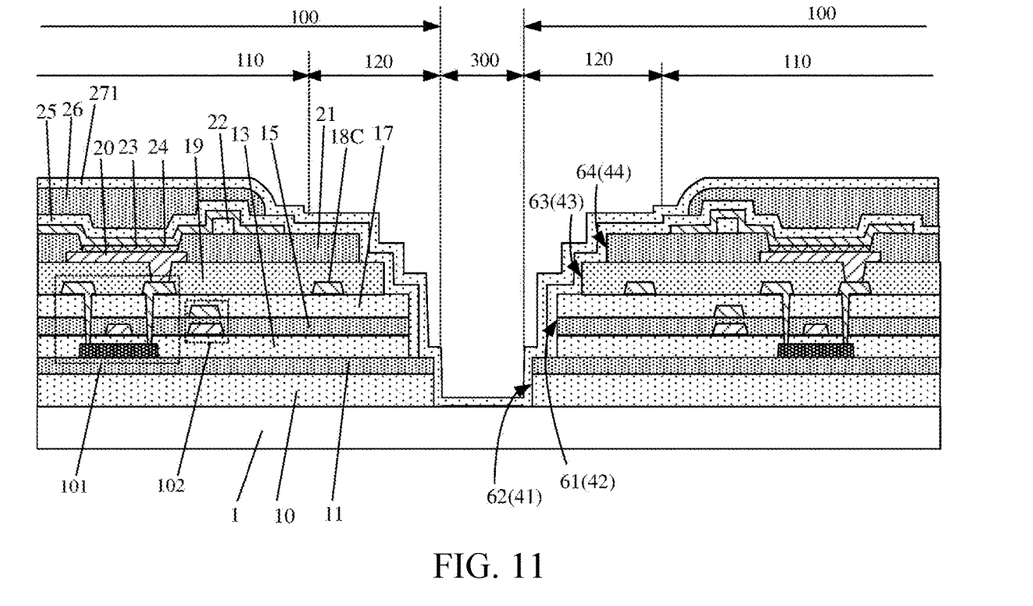
FIG. 11 is a schematic diagram of a structure after an encapsulation structure thin film is formed in some exemplary embodiments.

(4) An encapsulation layer is formed on the flexible base substrate 10 formed with the aforementioned pattern. In some exemplary embodiments, the preparation process of this step may include:

A first inorganic encapsulation layer 25 is formed on the flexible base substrate 10 formed with the aforementioned pattern and may be formed on the island area 100 and the bridge area 200. The first inorganic encapsulation layer 25 may be formed on the stepped structure of the edge area 120 of the island area 100 or/and the edge area of the bridge area 200, as shown in FIG. 11. The first inorganic encapsulation layer 25 may be prepared by using chemical vapor deposition (CVD).

An organic encapsulation layer 26 is formed on the first inorganic encapsulation layer 25 of the light emitting area 110 of the island area 100, as shown in FIG. 11. The organic encapsulation layer 26 may be prepared by using an ink jet printing process.

The preparation of the second inorganic encapsulation layer 27 may include following steps:

A second inorganic encapsulation thin film 271 is formed on the flexible base substrate 10 formed with the organic encapsulation layer 26 at first, and the second inorganic encapsulation thin film 271 is formed on the island area 100, the bridge area 200, and the surface of the hard carrier plate 1 exposed by the hole area 300, and the second inorganic encapsulation thin film 271 is formed on the stepped structure of the edge area, as shown in FIG. 11. The second inorganic encapsulation thin film 271 may be prepared by chemical vapor deposition (CVD).

Figure 12A:
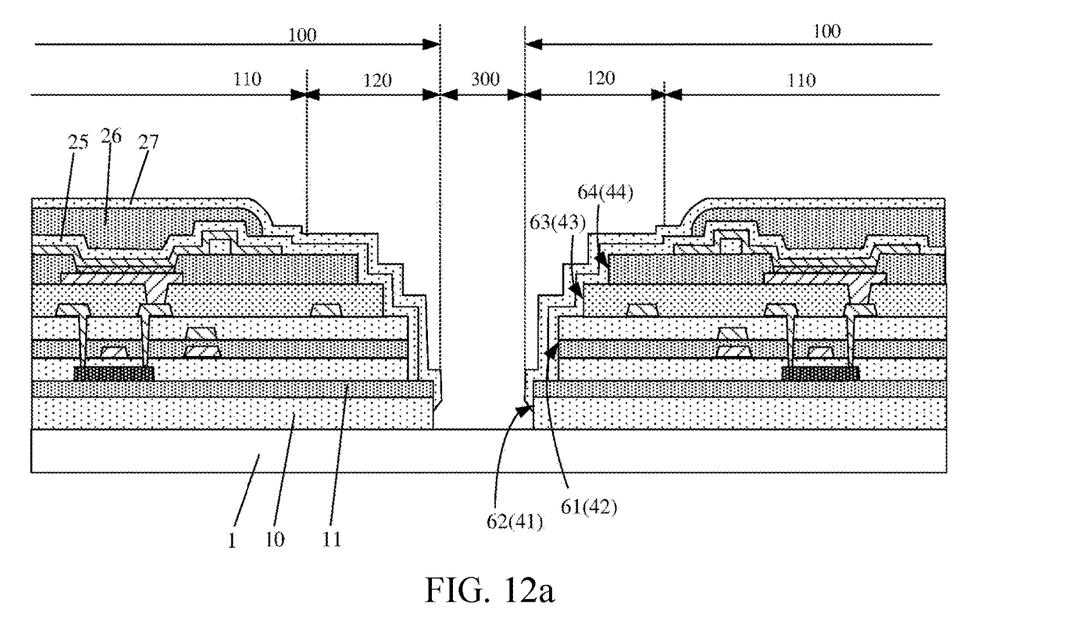
FIG. 12a is a schematic diagram of a structure after an encapsulation structure layer is formed in some exemplary embodiments.

Then, the second inorganic encapsulation thin film 271 of the entire area of the surface of the hard carrier plate 1 exposed by the hole area 300 is removed (including the removal of the inorganic encapsulation thin film 271 at an intersection position where the first step side surface intersects the surface of the hard carrier plate 1 exposed by the hole area 300), so as to disconnect the inorganic encapsulation thin film 271 in the edge area from the inorganic encapsulation thin film 271 on the hard carrier plate 1; therefore, the remaining second inorganic encapsulation thin film 271 on the display substrate is the second inorganic encapsulation layer 27, as shown in FIG. 12a.

Figure 12B:
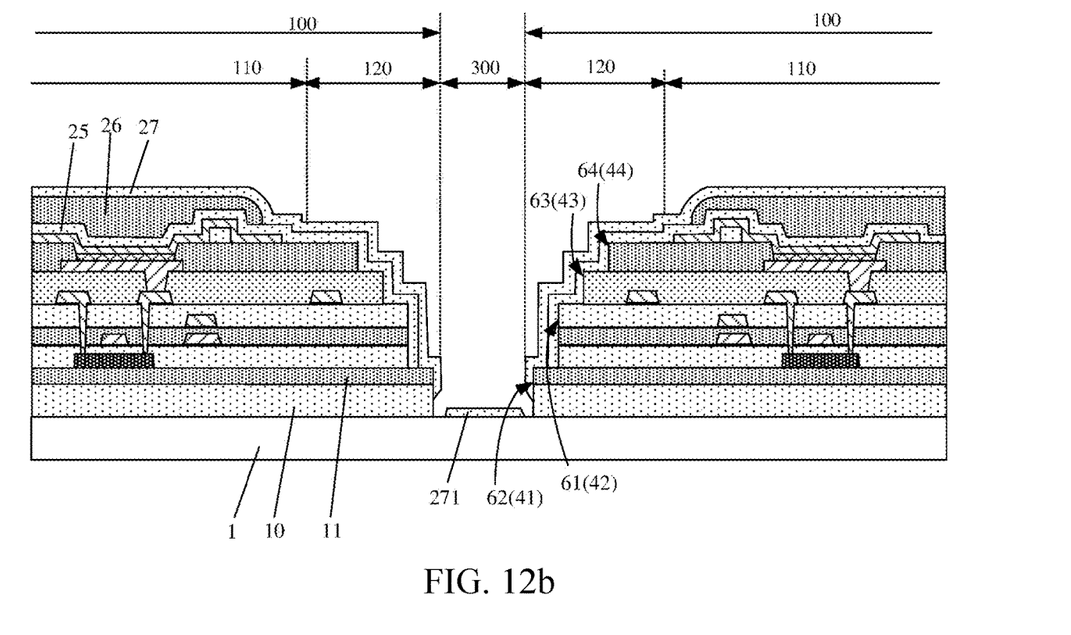
FIG. 12b is a schematic diagram of a structure after an encapsulation structure layer is formed in some other exemplary embodiments.

Alternatively, the second inorganic encapsulation thin film 271 of the peripheral area of the surface of the hard carrier plate 1 exposed by the hole area 300 close to the first step side surface (i.e., the circumferential edge area of the surface of the hard carrier plate 1 exposed by the hole area 300) is removed (including the removal of the inorganic encapsulation thin film 271 at an intersection position where the first step side surface intersects with the surface of the hard carrier plate 1 exposed by the hole area 300), such that the inorganic encapsulation thin film 271 of the edge area is disconnected from the inorganic encapsulation thin film 271 on the hard carrier plate 1; therefore, the second inorganic encapsulation thin film 271 on the display substrate is the second inorganic encapsulation layer 27, as shown in FIG. 12b.

Figure 12C:
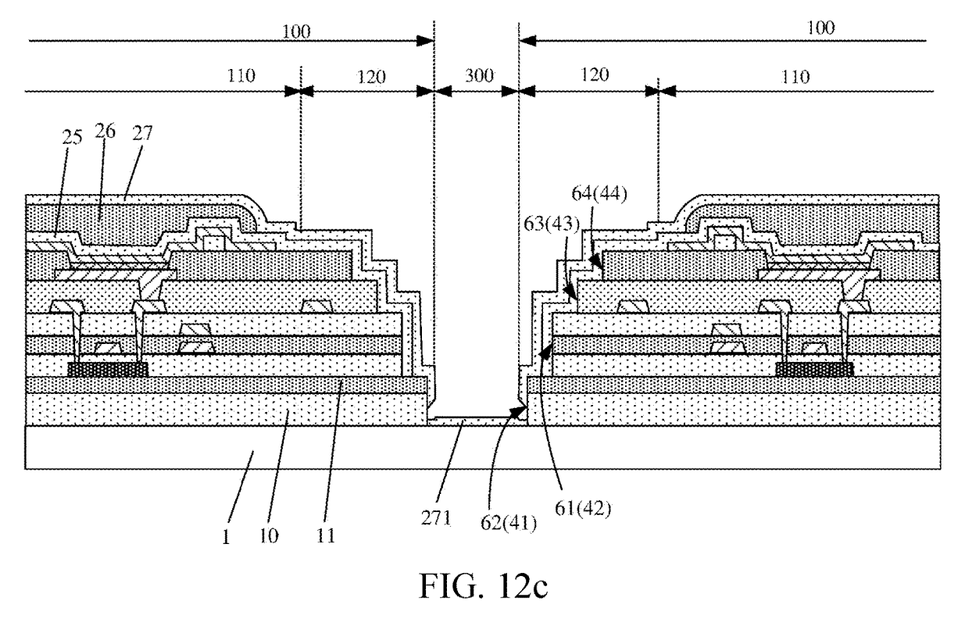
FIG. 12c is a schematic diagram of a structure after and an encapsulation structure layer is formed in some yet other exemplary embodiments.

Alternatively, the inorganic encapsulation thin film 271 on the first step side surface close to an intersection position, which is the intersection position of the first step side surface and the surface of the hard carrier plate 1 exposed by the hole area 300, is removed, such that the inorganic encapsulation thin film 271 in the edge area is disconnected from the inorganic encapsulation thin film 271 on the hard carrier plate 1. After disconnection, the inorganic encapsulation thin film 271 in the circumferential edge area of the surface of the hard carrier plate 1 exposed by the hole area 300 is possible to be partially removed in the thickness direction, and still be connected with the first step side surface, as shown in FIG. 12c, this part of the second inorganic encapsulation thin film 271 can be stripped off from the first step side surface along with the hard carrier plate 1 in the subsequent process of stripping the hard carrier plate 1 from the display substrate. The second inorganic encapsulation thin film 271 left on the display substrate after striping is the second inorganic encapsulation layer 27, and the structure of the final second inorganic encapsulation layer 27 can be shown in FIG. 3a. A part of the inorganic encapsulation thin film 271 is removed, as shown in FIGS. 12a, 12b, and 12c, such that the inorganic encapsulation thin film 271 in the edge area is disconnected from the inorganic encapsulation thin film 271 on the hard carrier plate 1, and the structure of the second inorganic encapsulation layer 27 finally formed by such method can be shown in FIG. 3a.

After the second inorganic encapsulation layer 27 is formed, the hard carrier plate 1 is stripped from the display substrate to obtain the display substrate according to the embodiment of the present disclosure. The structure of the display substrate can be shown in FIG. 3a.

In the above three methods of forming the second inorganic encapsulation layer 27, the removal of a part of the second inorganic encapsulation thin film 271 on the first step side surface may be performed by an etching process. After the etching process is completed, the second inorganic encapsulation thin film 271 on the first step side surface and on the surface of the hard carrier plate 1 exposed by the hole area 300 may simultaneously have the etched structure shown in FIGS. 12b and 12c at different positions due to an unstable factor that may exist in the etching conditions during the etching process. After the hard carrier plate 1 is striped off from the display substrate, the second inorganic encapsulation layer 27 finally formed on the display substrate may all be in such a configuration that an edge of the second inorganic encapsulation layer 27 is located on the first step side surface and the second inorganic encapsulation layer 27 exposes an area of the first step side surface close to a side surface of the base substrate away from the display side, as shown in FIG. 3a.

In the method of forming the second inorganic encapsulation layer 27 shown in FIGS. 12a, 12b, and 12c, before the second inorganic encapsulation thin film 271 is formed, the first step side surface and the surface of the hard carrier plate 1 exposed by the hole area 300 are not covered by the first inorganic encapsulation layer 25. In other examples, before the second inorganic encapsulation thin film 271 is formed, the first inorganic encapsulation thin film can be formed on the island area 100, the bridge area 200, the stepped structure of the edge area, and on the surface of the hard carrier plate 1 exposed by the hole area 300. In this way, after the second inorganic encapsulation thin film 271 is subsequently formed, on the first step side surface and the surface of the hard carrier plate 1 expose by the hole area 300, the second inorganic encapsulation thin film 271 is formed on the first inorganic encapsulation thin film. In an etching process for the second inorganic encapsulation thin film 271, the second inorganic encapsulation thin film 271 and the first inorganic encapsulation thin film at corresponding positions on the first step side surface and the surface of the hard carrier plate 1 exposed by the hole area 300 are simultaneously removed, and the first inorganic encapsulation layer 25 and the second inorganic encapsulation layer 25 are simultaneously formed on the display substrate after etching or striping off the hard carrier plate 1 from the display substrate.

A manufacturing method for a display substrate according to an embodiment of the present disclosure includes: a stepped structure is formed at an edge area of the island area 100 or/and the bridge area 200 towards the hole area 300, an inorganic encapsulation thin film is formed on the stepped structure and on the surface of the hard carrier plate 1 exposed by the hole area 300, and the inorganic encapsulation thin film at an intersection position where the first step side surface (the side surface of the first step with the lowest height in the stepped structure towards the hole area 300) intersects with the surface of the hard carrier plate 1 exposed by the hole area 300 is removed, alternatively, the inorganic encapsulation thin film on the first step side surface close to the intersection position is removed, so that the inorganic encapsulation thin film in the edge area is disconnected from the inorganic encapsulation thin film on the hard carrier plate 1, and thereafter the hard carrier plate is striped off from the base substrate. Therefore, due to the design of the stepped structure, the thickness of inorganic encapsulation thin film at the step will be thinner than that at other position. When the inorganic encapsulation thin film is removed by an etching process, the inorganic encapsulation thin film is readily to be etched cleanly, and be disconnected completely from the inorganic encapsulation thin film on the hard carrier plate 1, thereby reducing damage such as cracks resulted from pulling the inorganic encapsulation thin film at the side wall of the hole area 300 by the inorganic encapsulation thin film on the hard carrier plate 1 during a subsequent removal process. In addition, the inorganic encapsulation thin film in the edge area is disconnected from the inorganic encapsulation thin film on the hard carrier plate on the first step side close to the back side of the base substrate (the side surface of the base substrate away from the display side), such that the edge of the inorganic encapsulation layer in the final edge area is close to the back side of the base substrate. In this way, on the one hand, the thickness of the inorganic encapsulation thin film at the first step side surface as mentioned above is relatively small, and the inorganic encapsulation thin film is readily to be etched cleanly during the etching process, which is beneficial to the complete disconnection of the inorganic encapsulation thin film; on the other hand, the encapsulation length of the inorganic encapsulation layer in the edge area as well as the encapsulation performance can be ensured.

Base on the aforementioned contents, an embodiment of the present disclosure also provides a manufacturing method for a display substrate, wherein the display substrate includes a plurality of island areas spaced apart from each other, a plurality of hole areas, and bridge areas for connecting adjacent island areas, wherein the hole area includes one or more openings penetrating the display substrate, the manufacturing method including:

forming a base substrate of the display substrate on a hard carrier plate;

forming a composite structure layer on the base substrate of an edge area of the island area or/and the bridge area adjacent to the hole area, wherein a stepped structure is formed at a side surface of the composite structure layer towards the hole areas, the height of steps in the stepped structure gradually decreases along a direction towards the hole area, a first step with the lowest height in the stepped structure includes the base substrate, and a side surface of the first step towards the hole area is a first step side surface;

forming an inorganic encapsulation thin film in the edge area and on a surface of the hard carrier plate exposed by the hole area, wherein the inorganic encapsulation thin film is disposed on the composite structure layer and on the stepped structure;

removing the inorganic encapsulation thin film at an intersection position where the first step side surface intersects a surface of the hard carrier plate exposed by the hole area, alternatively, removing the inorganic encapsulation thin film on the first step side surface close to the intersection position to disconnect the inorganic encapsulation thin film of the edge area from the inorganic encapsulation thin film on the hard carrier plate, wherein the intersection position refers to an intersection position of the first step side surface and the surface of the hard carrier plate exposed by the hole area;

striping off the hard carrier plate from the base substrate to obtain the display substrate, wherein the inorganic encapsulation thin film in the edge area of the display substrate is an inorganic encapsulation layer, an edge of the inorganic encapsulation layer is located on the first step side surface, and the inorganic encapsulation layer exposes at least a partial area of the first step side surface.

In some examples, the removal of the inorganic encapsulation thin film at an intersection position where the first step side surface intersects the surface of the hard carrier plate exposed by the hole area includes removing the inorganic encapsulation thin film in the circumferential edge area or the entire area of the surface of the hard carrier plate exposed by the hole area.

In some examples, while the inorganic encapsulation thin film on the first step side surface close to an intersection position is removed, the inorganic encapsulation thin film in the circumferential edge area of the surface of the hard carrier plate exposed by the hole area is partially removed in a thickness direction.

An embodiment of the present disclosure further provides a display device, which includes the display substrate according to any one of the previous embodiments. The display device may be any product or component with a display function, such as a mobile phone, a tablet computer, a television, a display, a laptop computer, a digital photo frame, or a navigator.

In the description herein, orientation or positional relations indicated by terms "up", "down", "left", "right", "top", "inside", "outside", "axial direction", "four corners" and the like are based on the orientation or positional relations shown in the drawings, which are only simplified description for facilitating describing the embodiments of the present disclosure, rather than indicating or implying that the structures referred to have a specific orientation, and are constructed and operated in a specific orientation, and thus cannot be interpreted as a limitation on the present disclosure.

In the description herein, unless otherwise specified and defined explicitly, the terms "connection", "fixed connection", "installation" and "assembly" should be broadly understood, which, for example, may be a fixed connection, a detachable connection, or an integral connection; and the terms "installation", "connection" and "fixed connection" may be a direct connection, or an indirect connection through an intermediary, or an internal connection between two elements. Those of ordinary skills in the art may understand the meanings of the above terms in the specification.

The invention claimed is:

1. A display substrate, comprising a plurality of island areas spaced apart from each other, a plurality of hole areas, and bridge areas for connecting adjacent island areas, wherein
the hole area comprises one or more openings penetrating the display substrate;
the island area comprises an edge area adjacent to the hole area;
the edge area comprises a composite structure layer disposed on a base substrate, a stepped structure is formed at a side surface of the composite structure layer towards the hole areas, the height of steps in the stepped structure gradually decreases along a direction towards the hole area, a first step with the lowest height in the stepped structure comprises the base substrate, and a side surface of the first step towards the hole area is a first step side surface; and
the edge area further comprises an inorganic encapsulation layer disposed on the composite structure layer and disposed on the stepped structure, wherein an edge of the inorganic encapsulation layer is located on the first step side surface, and the inorganic encapsulation layer exposes at least a partial area of the first step side surface;
wherein the first step side surface comprises a first plane and a second plane intersecting each other and being adjacent to the hole area, and a convex edge protruding towards the hole area is formed at the intersection of the first plane and the second plane adjacent to the hole area.

2. The display substrate according to claim 1, wherein the edge of the inorganic encapsulation layer is located on an area of the side surface of the first step corresponding to the base substrate.

3. The display substrate according to claim 1, wherein the composite structure layer of the edge area comprises an inorganic composite insulation layer disposed on the base substrate and an organic composite layer disposed on the inorganic composite insulation layer, and the stepped structure comprises at least one step formed on the inorganic composite insulation layer and at least one step formed on the organic composite layer.

4. The display substrate according to claim 3, wherein the inorganic composite insulation layer comprises a first insulation layer, a second insulation layer, a third insulation layer and a fourth insulation layer which are sequentially stacked on the base substrate; the organic composite layer comprises a first organic insulation layer and a second organic insulation layer which are sequentially stacked on the fourth insulation layer.

5. The display substrate according to claim 4, wherein the stepped structure comprises the first step formed by the first insulation layer and the base substrate, a second step formed by the second insulation layer, the third insulation layer and the fourth insulation layer, a third step formed by the first organic insulation layer, and a fourth step formed by the second organic insulation layer; or
the stepped structure comprises the first step formed by the base substrate and the inorganic composite insulation layer, a second step formed by the first organic insulation layer, and a third step formed by the second organic insulation layer.

6. The display substrate according to claim 4, wherein the first organic insulation layer is located at same layer and made of same material as a planarization layer of the island area, and the second organic insulation layer is located at same layer and made of same material as a pixel definition layer of the island area.

7. A display device comprising the display substrate according to claim 1.

8. A manufacturing method for a display substrate, wherein the display substrate comprises a plurality of island areas spaced apart from each other, a plurality of hole areas, and bridge areas for connecting adjacent island areas, the hole area comprises one or more openings penetrating the display substrate, the manufacturing method comprising:
forming a base substrate of the display substrate on a hard carrier plate;
forming a composite structure layer on the base substrate of an edge area of the island area adjacent to the hole area, wherein a stepped structure is formed at a side surface of the composite structure layer towards the hole areas, the height of steps in the stepped structure gradually decreases along a direction towards the hole area, a first step with the lowest height in the stepped structure comprises the base substrate, and a side surface of the first step towards the hole area is a first step side surface;
forming an inorganic encapsulation thin film in the edge area and on a surface of the hard carrier plate exposed by the hole area, wherein the inorganic encapsulation thin film is disposed on the composite structure layer and on the stepped structure;

removing the inorganic encapsulation thin film at an intersection position where the first step side surface intersects a surface of the hard carrier plate exposed by the hole area, or removing the inorganic encapsulation thin film on the first step side surface close to the intersection position to disconnect the inorganic encapsulation thin film of the edge area from the inorganic encapsulation thin film on the hard carrier plate, wherein the intersection position refers to an intersection position of the first step side surface and the surface of the hard carrier plate exposed by the hole area; and striping off the hard carrier plate from the base substrate to obtain the display substrate, wherein the inorganic encapsulation thin film in the edge area of the display substrate is an inorganic encapsulation layer, an edge of the inorganic encapsulation layer is located on the first step side surface, and the inorganic encapsulation layer exposes at least a partial area of the first step side surface;

wherein the first step side surface comprises a first plane and a second plane intersecting each other and being adjacent to the hole area, and a convex edge protruding towards the hole area is formed at the intersection of the first plane and the second plane adjacent to the hole area.

9. The manufacturing method for a display substrate according to claim 8, wherein removing the inorganic encapsulation thin film at an intersection position where the first step side surface intersects the surface of the hard carrier plate exposed by the hole area comprises removing the inorganic encapsulation thin film at a circumferential edge area or the entire area of the surface of the hard carrier plate exposed by the hole area.

10. The manufacturing method for a display substrate according to claim 8, wherein the inorganic encapsulation thin film in the circumferential edge area of the surface of the hard carrier plate exposed by the hole area is partially removed in a thickness direction, while removing the inorganic encapsulation thin film on the first step side surface close to an intersection position.

* * * * *